(12) United States Patent
Eldredge (10) Patent No.: US 7,348,809 B2
(45) Date of Patent: Mar. 25, 2008

(54) INPUT BUFFER

(75) Inventor: Adam B. Eldredge, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 11/387,357

(22) Filed: Mar. 23, 2006

(65) Prior Publication Data

US 2007/0222484 A1 Sep. 27, 2007

(51) Int. Cl.
*H03B 1/00* (2006.01)
*H03K 3/00* (2006.01)

(52) U.S. Cl. ............... 327/108; 327/318; 327/319; 327/323; 327/379; 327/391; 326/83

(58) Field of Classification Search .......... 327/65, 327/108, 333, 560, 561, 562, 563, 315, 316, 327/318, 319, 323, 324, 327, 328, 379, 391; 330/252, 253; 326/83
See application file for complete search history.

(56) References Cited

U.S. PATENT DOCUMENTS

| | | | | |
|---|---|---|---|---|
| 5,334,883 A * | 8/1994 | Rosenthal | ............ | 327/206 |
| 5,939,904 A * | 8/1999 | Fetterman et al. | ............ | 327/67 |
| 5,959,490 A * | 9/1999 | Candage et al. | ............ | 327/333 |
| 6,768,352 B1 * | 7/2004 | Maher et al. | ............ | 327/112 |
| 6,788,142 B2 * | 9/2004 | Li et al. | ............ | 330/253 |
| 2005/0275431 A1* | 12/2005 | Cho | ............ | 326/83 |

OTHER PUBLICATIONS

Tom Palkert, "Optical Internetworking Forum: OIF OC-48, OC-192 & OC-768 Electrical Interfaces," date unknown, pp. 1-15.
Fairchild Semiconductor Corporation, "LVDS Fundamentals," Jun. 2005, pp. 1-5.

* cited by examiner

*Primary Examiner*—Tuan T. Lam
*Assistant Examiner*—Patrick O'Neill
(74) *Attorney, Agent, or Firm*—Trop, Pruner & Hu, P.C.

(57) ABSTRACT

In one embodiment, the present invention includes an input buffer with a common gate amplifier having input terminals coupled to receive an incoming common mode voltage. The common gate amplifier may be configured to receive the incoming common mode voltage over a wide range of levels extending from a low end lower than a supply voltage of the input buffer to a high end exceeding the supply voltage.

21 Claims, 6 Drawing Sheets

INPUT BUFFER

FIELD OF THE INVENTION

The present invention relates to an input buffer, and more particularly to an input buffer for use with differential signals.

BACKGROUND

Input buffers are used in many different systems to receive incoming signals and convert them to desired characteristics for a given system. For example, input buffers often receive signals at a voltage level of driver circuitry that transmitted the signals and convert the signals to a voltage of processing circuitry of a system component.

In devices used in certain systems such as optical systems, e.g., in framers, serializer/deserializers (SERDES) and other such devices, signaling between devices often occurs according to a low voltage differential signaling (LVDS) protocol. LVDS signals can be high speed signals typically provided at a low voltage, low power differential value. In general, LVDS signals are transmitted at a common mode voltage of 1.25 volts (V) with a swing between the differential voltages in the range of several hundred millivolts (mV). A voltage shift may occur between a level at which a driver transmits signals and a level at which a receiver receives such signals. Such a voltage difference may correspond to a common mode voltage difference, e.g., due to IR drops across a ground potential. Alternately, such voltage shifts may occur when an input buffer such as an LVDS input buffer is connected to an output buffer of another signaling protocol, such as a low voltage emitter coupled logic (ECL) or current mode logic driver, for example. Generally, the input common mode voltage ($V_{ICM}$) signals received by a receiver are in the range of approximately 0.5-2.35 V, in certain implementations.

As semiconductor devices advance, they are often powered at lower and lower supply voltages. For example, many of today's semiconductor devices are powered with a supply voltage of 1.3 V. Accordingly, when input common mode voltage signals are received at a higher level than the supply voltage, level shifting is first performed before any input buffer amplification or gain stages occur. As a result, this level shifting to a lower voltage causes a DC offset that is then manifested as noise when the signal is later amplified in further stages of an input buffer.

Typical input buffers used in LVDS signaling systems include transimpedance amplifiers (TIAs) that operate as level shifters. While such designs provide for a large common mode input range, a significant impedance mismatch may occur resulting in large offsets. Furthermore, the TIA needs a very large gain bandwidth to operate and also suffers from poor common mode rejection ratio (CMRR). CMRR is a ratio that indicates the amount of common mode rejection, i.e., the ability to reject noise that is coupled equally to the differential signals. Another solution for input buffers is to use a folded cascode amplifier. While this design improves upon the level shifter mismatches of a TIA design, input common mode voltage is limited on both the high and low sides. Also, a significant mismatch is present, and furthermore such an amplifier suffers from low bandwidth, which is unsuitable for high speed applications.

Accordingly, a need exists for an improved input buffer to handle incoming signals, especially where such signals may exceed a supply voltage of the input buffer.

SUMMARY OF THE INVENTION

In one aspect, the present invention includes an input buffer with a common gate amplifier having input terminals coupled to receive an incoming common mode voltage. The common gate amplifier may be configured to receive the incoming common mode voltage over a wide range of levels that extends from a low end with a value lower than a supply voltage of the input buffer to a high end with a value that exceeds the supply voltage. The high end of the range can vary in different implementations, however it is to be understood that the level may substantially exceed the supply voltage, and may be two or three times the supply voltage or more.

The input buffer may further include a bias circuit coupled to provide a bias voltage to gate terminals of the common gate amplifier. This bias circuit may provide the bias voltage at a level higher than the supply voltage, and may use the incoming common mode voltage to generate the bias voltage. The input buffer may be formed of multiple stages including an input stage formed of the common gate amplifier that acts as a combined level shifter and first gain stage coupled to directly receive the incoming common mode voltage, e.g., from a driver circuit. The input buffer may further include a second gain stage coupled to output terminals of the first gain stage, where the second gain stage is configured to receive an output voltage of the first gain stage at a level lower than the supply voltage. An input buffer in accordance with an embodiment of the present invention may include additional circuitry, such as a feedback circuit to receive an output voltage of the second gain stage and to control a gate voltage of a pair of input transistors of the first gain stage to introduce hysteresis, a voltage limiting circuit to limit the output voltage of the first gain stage to less than the supply voltage, among other such circuitry.

Another aspect of the present invention is directed to a method for receiving an input common mode voltage in an input buffer, and directly amplifying and level shifting the input common mode voltage in a first gain stage of the input buffer from a first voltage that can extend beyond a supply voltage of the input buffer to a second voltage no larger than the supply voltage. This input common mode voltage may be used to bias a common gate amplifier of the first gain stage. The common gate amplifier may thus provide an output to a second gain stage at the second voltage. Still further, an output of the second gain stage may be compared with a reference signal, and gate terminals of the common gate amplifier may be controlled based on the comparison.

Embodiments of the present invention may be implemented in many different system types. For example, a buffer may be implemented in a computer system, an optical system or other such systems that include drivers and receivers coupled to receive signals from the drivers. In one implementation, such a system may include a driver to transmit differential signals and a buffer coupled to the driver. The buffer may have a first gain stage coupled to receive the differential signals, where the first gain stage is configured to receive the differential signals at a voltage level that can exceed a supply voltage of the buffer. In this way, a system can account for voltage drops across a ground potential or differences in signaling protocols and supply voltages of different devices coupled to each other.

Yet another aspect is directed to an apparatus having a means for receiving an input common mode voltage in an input buffer and a gain stage means for directly amplifying and level shifting the input common mode voltage from a first voltage that can extend beyond a supply voltage of the input buffer to a second voltage no larger than the supply voltage. The apparatus may further include a means for biasing the gain stage means and feedback means to control the gain stage means. Embodiments of the present invention may be implemented in appropriate hardware, firmware, and software.

DETAILED DESCRIPTION

In various environments, an input buffer may receive incoming signals at an input common mode voltage greater than a supply voltage of the input buffer. As a result, incoming signals can be directly amplified in a gain stage in connection with any level shifting operations. Accordingly, improved signal performance is realized, as any offset introduced by level shifting prior to amplification is avoided. Furthermore, in various embodiments, an input buffer may include various features for use in connection with electrostatic discharge (ESD) protection, voltage protection for other portions of an input buffer that operate at lower voltages, and hysteresis reduction mechanisms. Of course, such an input buffer is equally adapted to receive incoming signals at levels lower than its supply voltage.

While different manners of handling such incoming signals can be realized, an example input buffer in accordance with an embodiment of the present invention will be described further. However, it is to be understood that the scope of the present invention is not limited in this regard.

Figure 1:
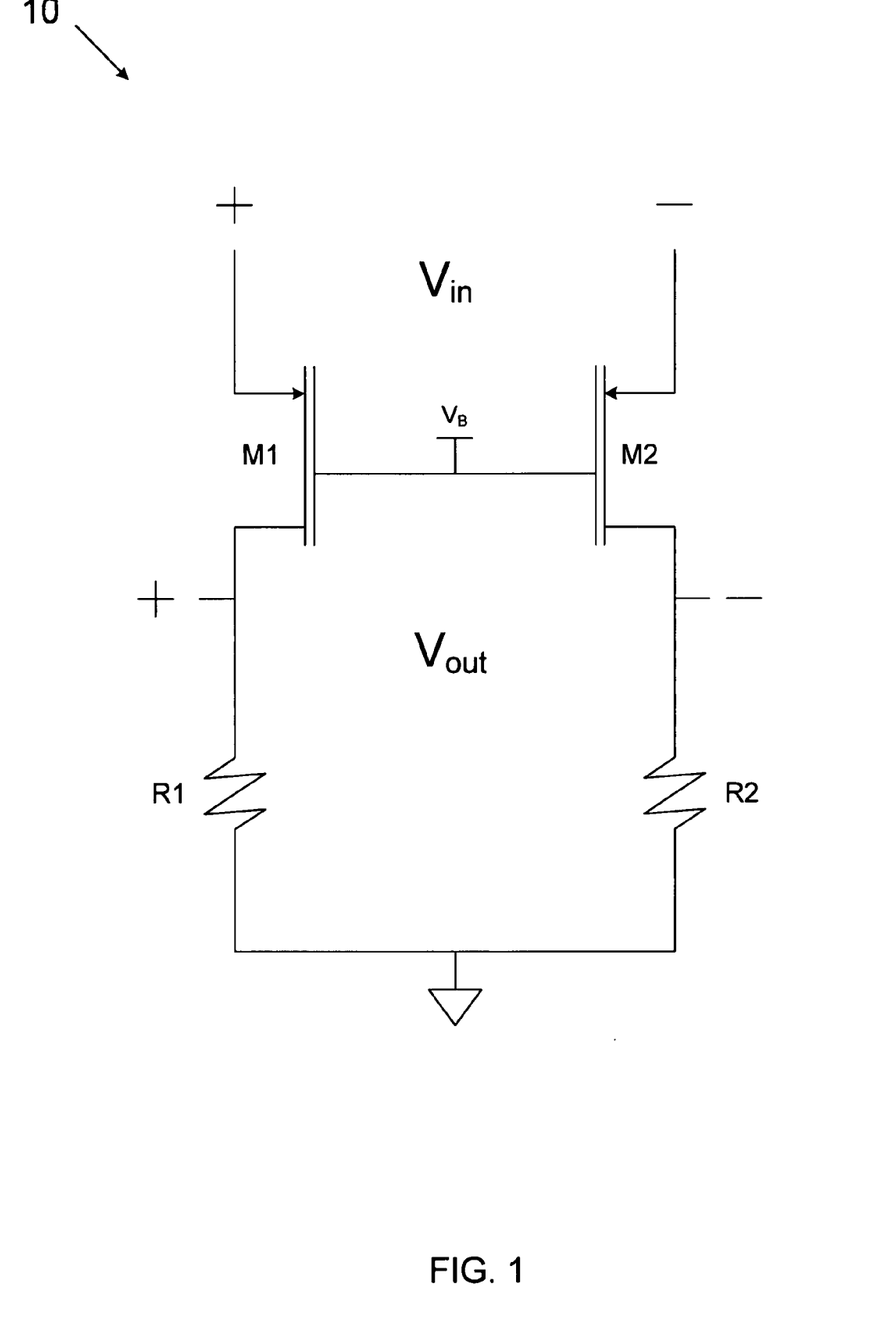
FIG. 1 is a schematic diagram a portion of an input buffer in accordance with embodiments of the present invention.

Referring now to FIG. 1, shown is a schematic diagram a portion of an input buffer in accordance with an embodiment of the present invention. More particularly, as shown in FIG. 1, a common gate amplifier 10 is shown. Such an amplifier may be used to provide level shifting and amplification of incoming common mode voltages. Specifically, as shown in FIG. 1, a differential input signal, i.e., $V_{IN}$ has respective high and low portions (also referred to herein as positive and negative) portions $V_{IN+}$ and $V_{IN-}$ coupled to source terminals of a pair of transistors M1 and M2. As shown in the embodiment of FIG. 1, transistors M1 and M2 may be metal oxide semiconductor effect transistors (MOSFETs) and more particularly pMOSFETs, although the scope of the present invention is not limited in this regard. MOSFETs M1 and M2 are coupled in a common gate configuration, in which both gate terminals are commonly coupled to receive a bias voltage, $V_B$. In turn, the drain terminals of MOSFETs M1 and M2 are coupled to provide a differential output signal from amplifier 10, i.e., $V_{OUT+}$ and $V_{OUT-}$. As shown, a pair of output terminals may be coupled between the drain terminals of transistors M1 and M2 and a pair of resistors R1 and R2 coupled to a reference voltage (e.g., a ground voltage). While shown with this particular configuration in the embodiment of FIG. 1, it is to be understood that the scope of the present invention is not so limited. Using common gate amplifier 10, improved mismatch on level shifting of the incoming common mode voltage may be realized. Specifically, because the drain terminals of MOSFETs M1 and M2 are high impedance output nodes, they are not sensitive to mismatch and accordingly, improved mismatch is realized.

In various embodiments, common gate amplifier 10 may have a predetermined gain, dictated by the relative sizes of MOSFETs M1 and M2 and of resistors R1 and R2. In some embodiments, amplifier 10 may provide a gain of between approximately 2 and 4, although the scope of the present invention is not limited this regard.

It is to be understood that FIG. 1 shows a simplified configuration of a common gate amplifier, and various additional features may be present in some embodiments. For example, a bias circuit may be present to generate the bias voltage provided to the gate terminals of MOSFETs M1 and M2. Furthermore, an ESD protection circuit may be present. Still further, circuitry for adding hysteresis and also protecting downstream circuitry, e.g., by limiting an output voltage of amplifier 10 may be present in some embodiments.

Still further, it is understood that an input buffer in accordance with an embodiment of the present invention may include multiple stages, in which common gate amplifier 10 is the first stage. For example, common gate amplifier 10 may represent a first stage of an input buffer that is directly coupled to receive incoming common mode voltage signals. In various implementations, additional stages may be coupled to amplifier 10, such as additional gain stages, logic converters such as a common mode logic (CML) to complementary metal oxide semiconductor (CMOS) converter, as well as output buffer stages and the like. Of course in other implementations amplifier 10 may be directly coupled to other logic or processing circuitry, such as present in a SERDES circuit or other semiconductor device.

Figure 2:
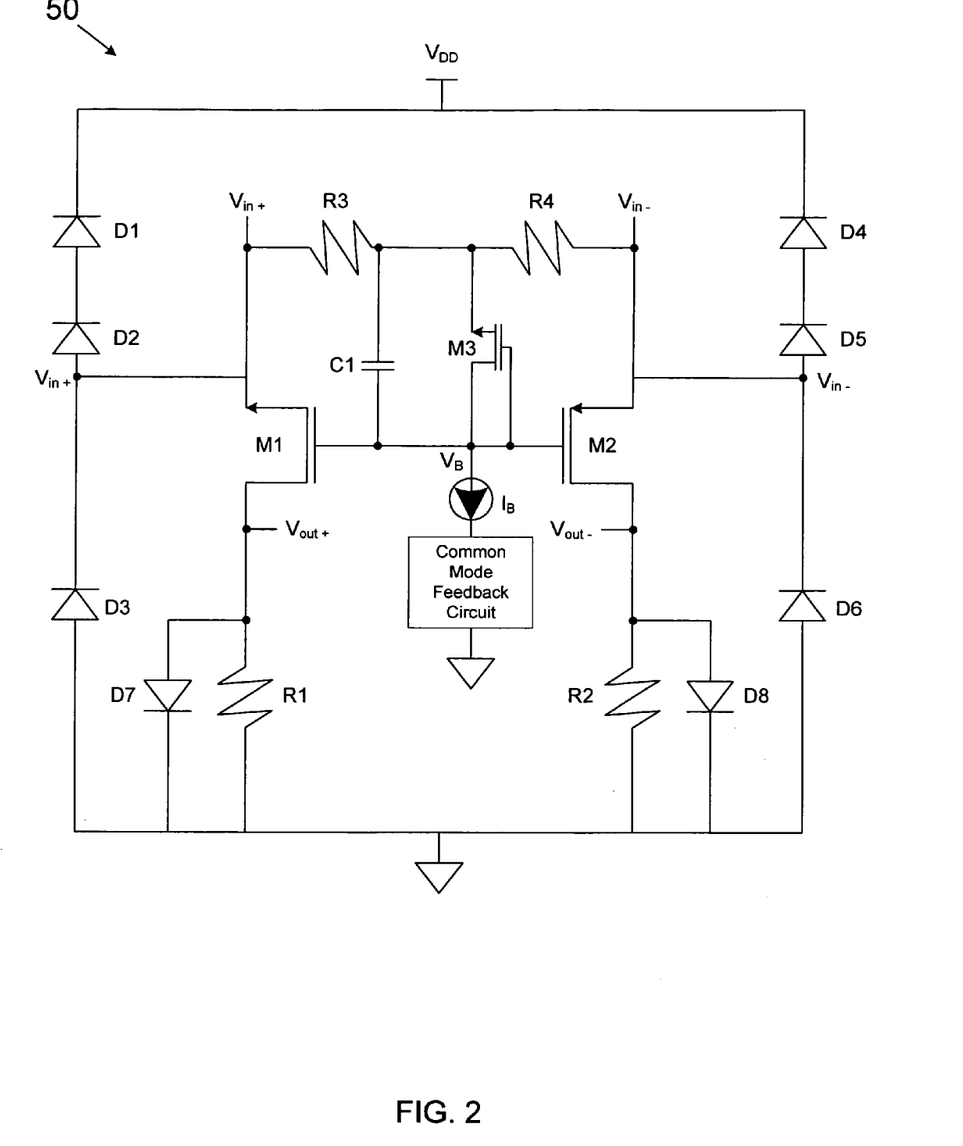
FIG. 2 is a schematic diagram of a portion of an input buffer in accordance with another embodiment of the present invention.

Referring now to FIG. 2, shown is a schematic diagram of a portion of an input buffer in accordance with another embodiment of the present invention. As shown in FIG. 2, a common gate amplifier 50 may include a pair of MOSFETs M1 and M2 coupled to receive an incoming common mode voltage signal at its source terminals. Furthermore, MOSFETs M1 and M2 have gate terminals coupled together to receive a bias voltage, $V_B$. As shown in the embodiment of FIG. 2, bias circuitry may be present to generate the bias voltage. In certain instances, the bias voltage $V_B$ may be provided at a voltage higher than a supply voltage of common gate amplifier 50.

More specifically, the bias circuitry may use the incoming common mode voltage signal to generate the bias voltage. As shown in FIG. 2, the input signals $V_{IN+}$ and $V_{IN-}$ are coupled through a pair of resistors R3 and R4 to a bypass capacitor C1 coupled in parallel with a MOSFET M3, which may be a diode-connected current mirror transistor. More specifically, as shown in FIG. 2, MOSFET M3 has a source terminal coupled between resistors R3 and R4. Note that resistors R3 and R4 may also be used as termination resistors, i.e., 100 ohm termination resistors. MOSFET M3 further has its gate and drain terminals commonly coupled with the gate terminals of MOSFETs M1 and M2 to provide the bias voltage. As further shown in FIG. 2, a current source $I_B$ may provide a bias current for the bias circuitry. In various embodiments, this bias current may be controlled by a common mode feedback circuit. That is, this current may be adjusted so that the output common mode voltage is at a desired level. In this way, the bias circuitry acts as a current mirror to set the proper bias voltage for common gate amplifier 50, and the incoming common mode voltage signal generates the bias voltage for MOSFETs M1 and M2. Bypass capacitor C1 may improve high frequency CMRR. Accordingly, MOSFETs M1 and M2 are biased using the same input common mode voltage signal provided to the source terminals of the devices.

Still referring to FIG. 2, ESD protection may be provided by way of stacked diodes coupled between a supply voltage ($V_{DD}$) and an input pad. More specifically, as shown in FIG. 2 a pair of diodes D1 and D2 may be coupled between an input pad coupled to the source terminal of MOSFET M1 and the supply voltage, while a third diode D3 is coupled between the input pad and the ground voltage. In various embodiments, the diodes may be formed via diode-connected stacked transistors. A similar stack of such diodes is further shown coupled between the supply voltage and the input pad on the negative input side of amplifier 50 (i.e., diodes D4 and D5 coupled between the supply voltage and the input pad and diode D6 coupled between the input pad and the ground voltage).

Thus in an embodiment such as FIG. 2, the maximum incoming common mode voltage may be limited by the breakdown voltage of MOSFETs M1 and M2 and the ESD diodes turning on. Of course, additional diodes can be added in series, and to allow an even higher input common mode voltage ($V_{ICM}$). Also, additional pMOSFETs may be coupled in series to prevent M1, M2 breakdown. Note that in various embodiments, MOSFETs M1 and M2 may be high voltage pMOS transistors. In such embodiments, the breakdown voltage may be greater than approximately 3.6 V. Accordingly, in various embodiments an input buffer may receive an input voltage that can extend well beyond its supply voltage. That is, the input voltage may be substantially greater than the supply voltage. In various implementations, such input voltages may be at levels as much as 3 V higher than a supply voltage, and even greater in some embodiments, particularly with additional diodes or cascoded transistors as described above. The minimum incoming common mode voltage may be limited by the threshold voltage of the input devices (i.e., $V_{GS}$ of MOSFETs M1 and M2, which may be approximately 0.8 V, in some embodiments).

In various implementations, amplifier 50 may be an input or first stage amplifier of an input buffer, which may be coupled to a second stage amplifier. Such a second stage amplifier may include low voltage transistors, rather than the high voltage transistors present in amplifier stage 50. Accordingly, in various embodiments, voltage limiting functionality may be provided to limit a maximum output voltage from amplifier stage 50. As shown FIG. 2 diodes D7 and D8 may be coupled to the output terminals of amplifier stage 50. These diodes may be diode-connected transistors that limit the output swing. For example, in an embodiment in which a supply voltage is operating at 1.3 V, the maximum output voltage from amplifier stage 50 may be less than 1.3 V, however the scope of the present invention is not limited in this regard.

Figure 3:
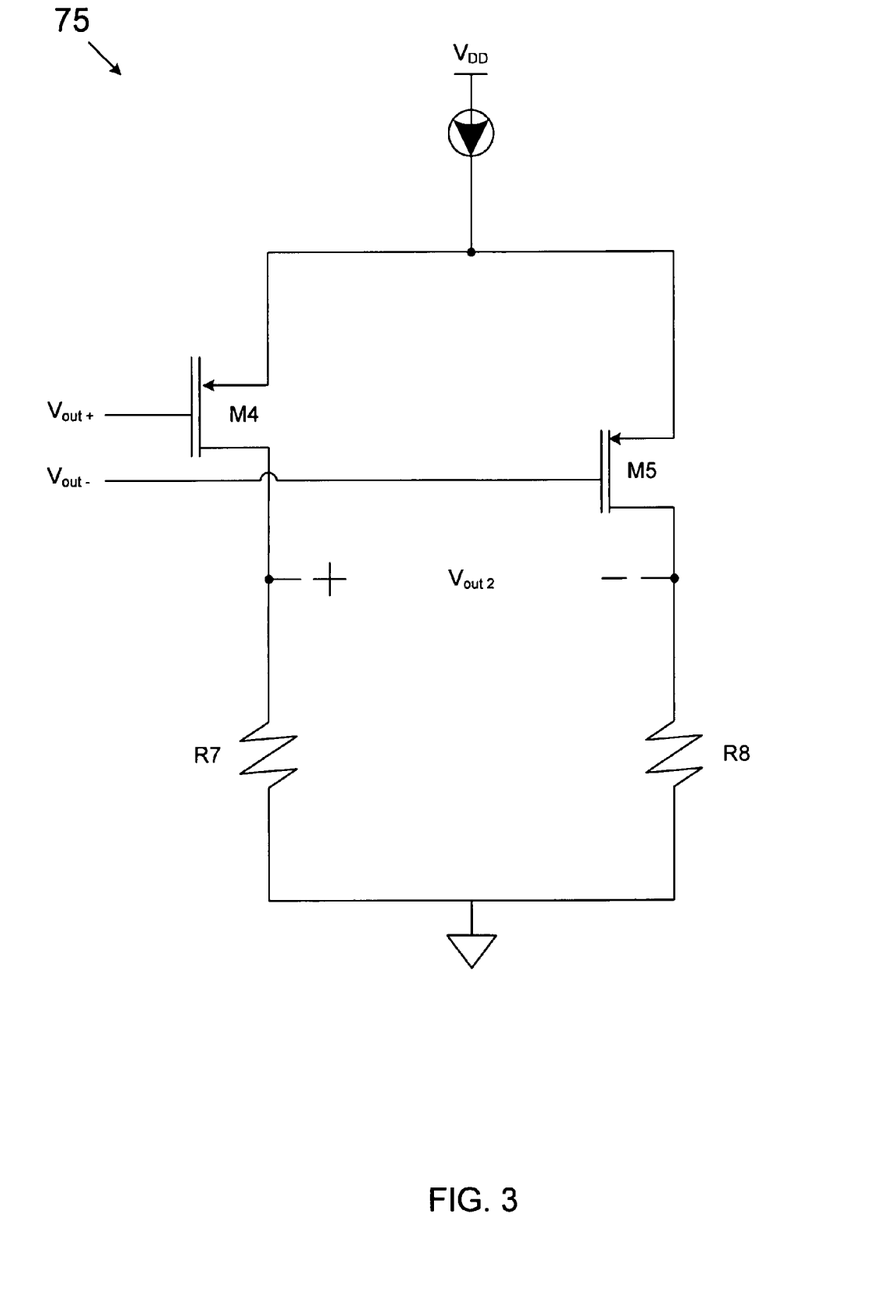
FIG. 3 is a schematic diagram of a second amplifier stage of an input buffer in accordance with an embodiment of the present invention.

Referring now to FIG. 3, shown is a schematic diagram of a second amplifier stage of an input buffer in accordance with an embodiment of the present invention. As shown in FIG. 3, second stage 75 may include MOSFETs M4 and M5, which may be pMOSFETs in one embodiment, that are coupled to receive at their gate terminals respective positive and negative input voltages $V_{OUT+}$ and $V_{OUT-}$. MOSFETs M4 and M5 may be low voltage transistors, in some embodiments. These input voltages may correspond to the output voltages from input stage amplifier 50 of FIG. 2, for example. Accordingly, these input signals may be limited to a lower voltage, e.g., 1.3 V or less. As further shown in FIG. 3, MOSFETs M4 and M5 may have commonly-coupled source terminals, which are coupled to a current source coupled between $V_{DD}$ and the commonly-coupled source terminals of MOSFETs M4 and M5. The differential output voltage from second stage 75 may be provided to additional circuitry within an input buffer or another portion of a semiconductor device via output terminals $V_{OUT2-}$ and $V_{OUT2+}$ coupled between the drain terminals of MOSFETs M4 and M5 and resistors R7 and R8 coupled thereto.

Figure 4:
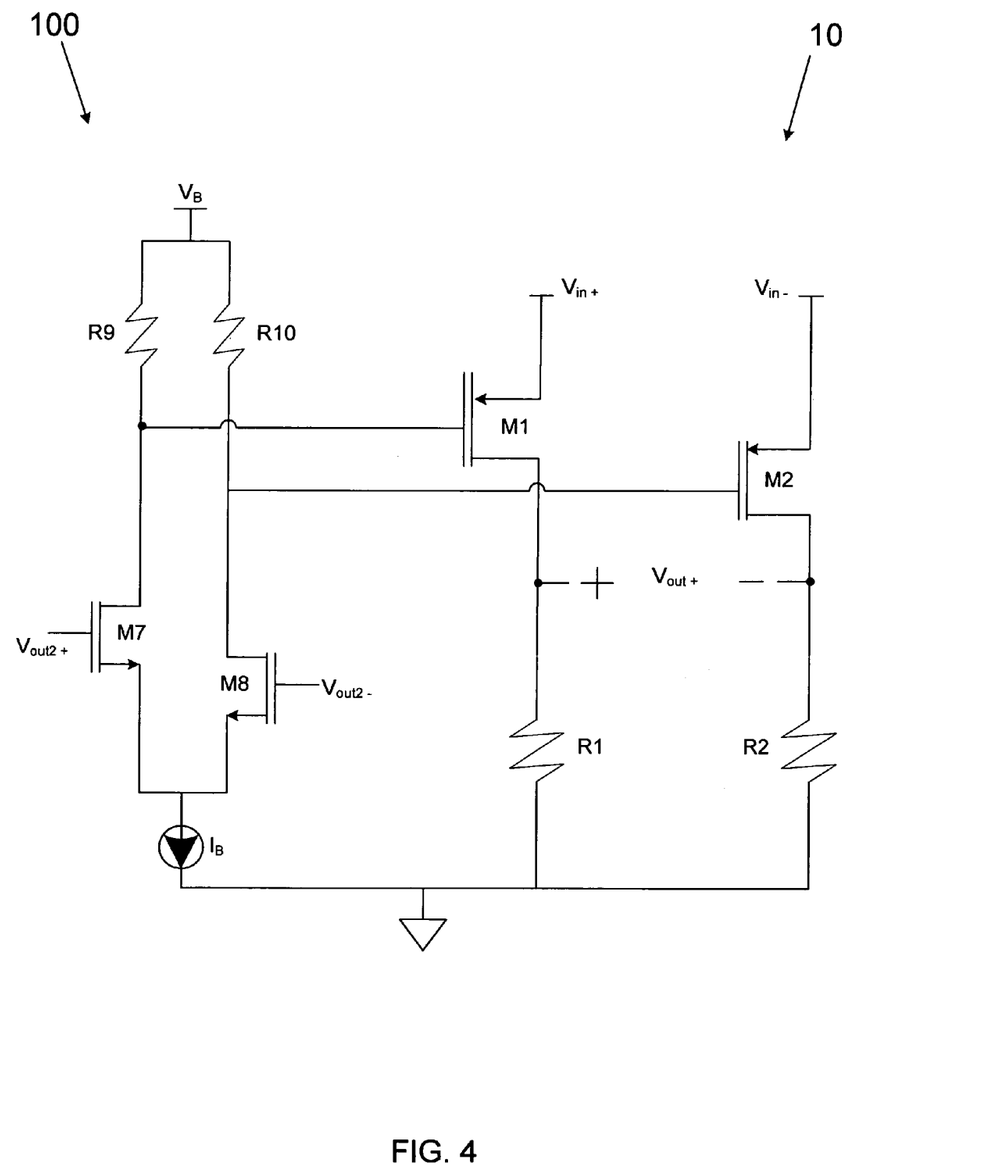
FIG. 4 is a schematic diagram of circuitry to insert hysteresis in accordance with one embodiment of the present invention.

In some situations, hysteresis may be present in an input buffer. Such hysteresis may be needed when input rise or fall times are slower than a bandwidth of the input buffer. Noise on the input signals can result in toggling at the output. Furthermore, outputs of such a buffer may toggle when no input is connected thereto. Accordingly, in various embodiments circuitry may be provided to insert hysteresis. Referring now to FIG. 4, shown is a schematic diagram of circuitry to insert hysteresis. As shown in FIG. 4, an amplifier 10 is shown, which may correspond to a first input stage of an input buffer, as described above. Note that in the embodiment of FIG. 4, the gate terminals of MOSFETs M1 and M2 are not commonly coupled. Instead, the gate terminals are coupled to receive voltages from a hysteresis circuit 100. Hysteresis circuit 100 includes a pair of transistors of MOSFETs M7 and M8, which may be nMOSFETs, in one embodiment. The gate terminals of MOSFETs M7 and M8 may be coupled to receive a feedback voltage from further along in the input buffer. For example, in one embodiment the gate terminals M7 and M8 may be coupled to receive the output voltage of first stage 10 (i.e., $V_{OUT+}$ and $V_{OUT-}$). In other embodiments, the gate terminals may be coupled to receive the output voltage of second stage 75 of FIG. 3, for example.

As further shown in FIG. 4, MOSFETs M7 and M8 have commonly-coupled source terminals, which are coupled to a current source $I_B$. In turn, the drain terminals of MOSFETs M7 and M8 are coupled to provide an output voltage to load resistors R9 and R10, which are also coupled to a bias voltage $V_B$, which may be a bias voltage generated, e.g., according to the bias circuitry in FIG. 2. Accordingly, the gate terminals of MOSFETs M1 and M2 are coupled to receive the outputs of the drain terminals of MOSFETs M7 and M8. In this way, glitches may be avoided, and the output of an input buffer may be prevented from toggling in the absence of an input. While shown with this particular implementation in the embodiment of FIG. 4, it is to be understood that the scope of the present invention is not limited in this regard.

While the present invention has been described with respect to the circuitry shown in the embodiments of FIGS. 1-4, it is to be understood that the scope of the present invention is not limited in this way, and various circuitry to enable receipt and processing of incoming differential signals (or single-ended signals) at an input voltage higher than a supply voltage of an input buffer may be realized.

Figure 5:
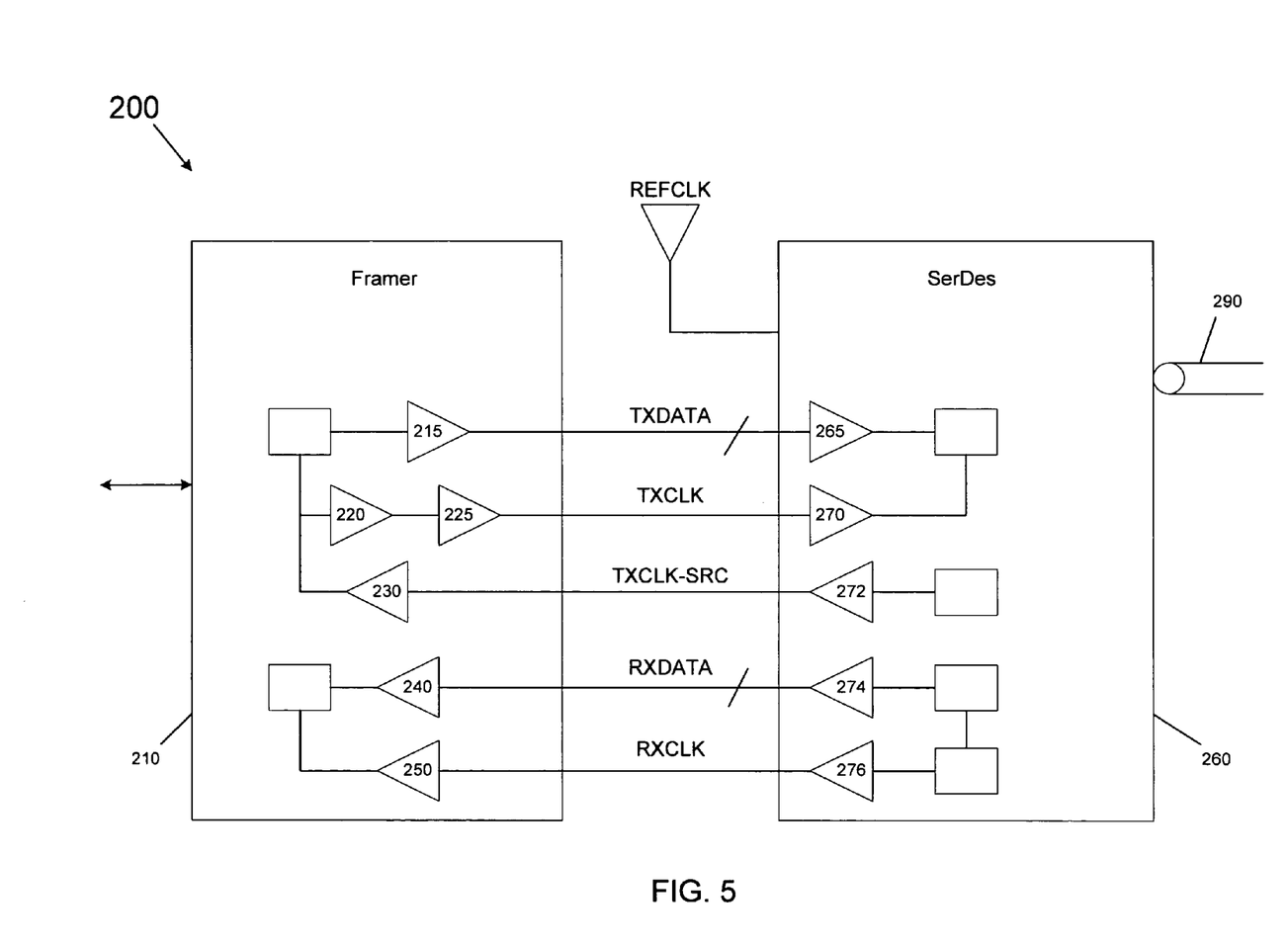
FIG. 5 is a block diagram of a system in accordance with an embodiment of the present invention.

Referring now to FIG. 5, shown is a block diagram of a system in accordance with one embodiment of the present invention. Specifically, FIG. 5 shows a portion of a system 200 that includes various components to enable transmission and reception of signals, and more specifically, preparing incoming electrical signals for transmission along an optical medium and processing incoming optical signals for conversion to electrical signals for further use in a system.

As shown in FIG. 5, system 200 receives electrical signals, which may be parallel electrical signals in a framer 210, which may be a framer in accordance with a synchronous optical network (SONET). As shown, framer 210 is coupled to receive incoming electrical signals from other portions of system 200. It is to be understood that various media access control (MAC)/physical coding sublayer (PCS) and/or physical media attach (PMA) devices may be present in various embodiments that may include such a framer.

As shown in FIG. 5, framer 210 receives signals and provides them via a plurality of drivers 215 (only one shown in FIG. 5) as transmit data (TXDATA). Furthermore, additional drivers 220 and 225 may be used to transmit a transmit clock (TXCLK). In turn, an input buffer 230 may be coupled to receive an incoming source clock (TXCLK_SRC). Still referring to FIG. 5, framer 210 may further include input buffers 240 and 250 coupled to receive incoming received data (RXDATA) along with a received data clock (RXCLK), which may be a recovered clock obtained from incoming optical data.

Still referring to FIG. 5, a serializer deserializer (SERDES) 260 may be coupled to framer 210. In addition to the signals described above, SERDES 260 is coupled to receive an incoming reference clock (REFCLK). While not shown for ease of illustration in the embodiment of FIG. 5, SERDES 260 may be part of a physical media device (PMD) which further includes transceivers to perform electrical-to-optical conversion, as well as conversion in the opposite direction from optical-to-electrical signals. Accordingly, SERDES 260 may be coupled to an optical medium, such as an optical fiber 290.

Note that SERDES 260 may include input buffers 265 and 270 which are coupled to receive incoming signals from framer 210. In various embodiments, these incoming signals may be LVDS signals, although the scope of the present invention is not limited in this regard. Furthermore, input buffers 265 and 270 may be buffers designed in accordance with an embodiment of the present invention. SERDES 260 further includes a plurality of drivers 272-276 to enable transmission of the various signals back to framer 210. Note that, in some embodiments input buffers 240 and 250 of framer 210 may further be designed in accordance with an embodiment of the present invention. While shown an embodiment of FIG. 5 in the context of an optical system, it is to be understood that the scope the present invention is not so limited, and input buffers in accordance with various embodiments may be implemented in any desired system type.

Figure 6:
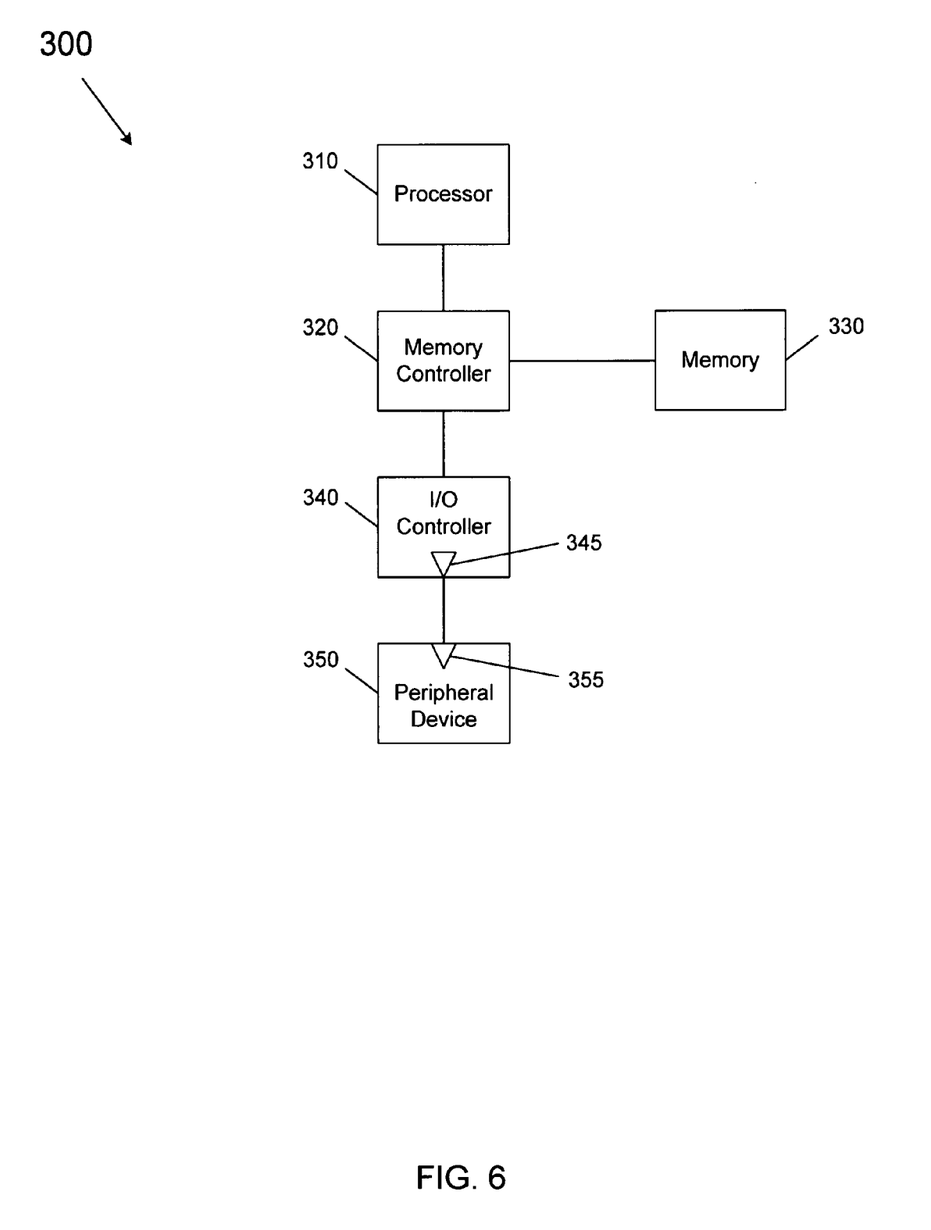
FIG. 6 is a block diagram of system in accordance with another embodiment of the present invention.

As an example, other embodiments may be implemented in a different system type such as a computer system. Referring now to FIG. 6, shown is a block diagram of a computer system with which embodiments of the present invention may be used. As shown in FIG. 6, system 300 may be a processor-based system that includes a processor 310 that is coupled to a memory controller 320, which in turn is coupled to a memory 330, which may be a system memory. Furthermore, memory controller 320 is coupled to an input/output (I/O) controller 340. In system 300, various components may operate at different supply voltages. For example, the various components shown in FIG. 6 may each be individual chips coupled to a motherboard. The motherboard may provide supply voltages to each of the chips, where one or more of the supply voltages may be at different levels, based on a particular chip's requirements. Furthermore, one or more of the chips may operate according to different communication protocols or at various logic levels. For example, I/O controller 340 may operate using ECL levels. Accordingly, signals sent from I/O controller 340 via an output driver 345 of the device may be sent at voltages of around 3.3 V in a low voltage positive ECL (LVPECL) scheme. These output differential signals may be provided to an input buffer 355 of a peripheral device 350 such as a fixed function device that performs a desired function for system 300. In various embodiments, input buffer 355 of peripheral device 350 may be in accordance with an embodiment of the present invention and may accordingly receive, level shift, and gain the incoming signal in an input stage of input buffer 355, as described above. Thus the incoming differential signal from I/0 controller 340 may be converted to a lower voltage, e.g., of a LVDS level where peripheral device 350 operates at a lower supply voltage, e.g., 1.3 V. While shown with these limited components in the embodiment of FIG. 6, it is to be understood that the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An input buffer comprising:
    a common gate amplifier having input terminals coupled to receive an incoming common mode voltage, wherein the common gate amplifier is configured to receive the incoming common mode voltage that extends beyond a supply voltage of the input buffer; and
    a bias circuit coupled to provide a bias voltage to gate terminals of the common gate amplifier, wherein the bias circuit is configured to provide the bias voltage at a level higher than the supply voltage of the input buffer, the bias circuit having a diode-connected current mirror transistor and a bypass capacitor coupled in parallel therewith and coupled between a resistor pair and the gate terminals of the common gate amplifier.

2. The input buffer of claim 1, wherein the bias circuit is coupled to receive the incoming common mode voltage and to generate the bias voltage therefrom.

3. The input buffer of claim 1, wherein the common gate amplifier comprises a level shifter and a first gain stage coupled to directly receive the incoming common mode voltage from a driver circuit.

4. The input buffer of claim 3, further comprising a second gain stage coupled to output terminals of the first gain stage, the second gain stage configured to receive an output voltage of the first gain stage at a level lower than the supply voltage of the input buffer.

5. The input buffer of claim 4, further comprising a feedback circuit to receive an output voltage of the second gain stage and to control a gate voltage of a pair of input transistors of the first gain stage to introduce hysteresis.

6. The input buffer of claim 4, further comprising a voltage limiting circuit coupled to the output terminals of the first gain stage to limit the output voltage of the first gain stage to less than the supply voltage of the input buffer.

7. The input buffer of claim 4, further comprising a voltage limiter coupled to the output terminals of the first gain stage to limit the output voltage to a predetermined level.

8. The input buffer of claim 1, wherein the common gate amplifier comprises:

a pair of transistors having the gate terminals commonly coupled, the pair of transistors having input terminals coupled to receive the incoming common mode voltage and output terminals coupled to provide an output voltage; and the bias circuit to bias the gate terminals, wherein the bias circuit is coupled to receive the incoming common mode voltage and to generate the bias voltage therefrom.

9. The input buffer of claim 1, further comprising a current source coupled to the gate terminals of the common gate amplifier, wherein the current source is controlled by a feedback circuit.

10. The input buffer of claim 1, further comprising a pair of diode stacks each having a first plurality of diodes coupled between the supply voltage of the input buffer and one of the input terminals of the common gate amplifier and a second diode coupled between the corresponding input terminal and a ground voltage.

11. The input buffer of claim 10, wherein the pair of diode stacks is to limit a maximum voltage of the incoming common mode voltage.

12. A method comprising:
receiving an input common mode voltage at input terminals of a common gate amplifier of a first gain stage of an input buffer;
directly amplifying and level shifting the input common mode voltage in the first gain stage of the input buffer from a first voltage that extends beyond a supply voltage of the input buffer to a second voltage no larger than the supply voltage;
providing an output of the common gate amplifier to a second gain stage at the second voltage;
providing an output of the second gain stage to a feedback circuit;
controlling a first transistor of the input buffer with a first voltage generated by the feedback circuit; and
controlling a second transistor of the input buffer with a second voltage generated by the feedback circuit, wherein the feedback circuit is gated by a feedback signal from the input buffer.

13. The method of claim 12, further comprising biasing the common gate amplifier using the input common mode voltage.

14. A system comprising:
a driver to transmit differential signals; and
a buffer coupled to the driver, the buffer having a first gain stage coupled to receive the differential signals, wherein the first gain stage is configured to receive the differential signals at a voltage level that exceeds a supply voltage of the buffer, the buffer including a bias circuit to provide a bias voltage to gate terminals of the first gain stage, wherein the bias circuit is coupled to receive the differential signals and generate the bias voltage therefrom, the bias circuit having a diode-connected current mirror transistor and a bypass capacitor coupled in parallel therewith and coupled between a resistor pair and the gate terminals of the first gain stage, and a controllable current source coupled to the gate terminals of the first gain stage, the buffer further including a pair of diode stacks each having a first plurality of diodes coupled between the supply voltage of the buffer and an input terminal of the first gain stage and a second diode coupled between the input terminal and a ground voltage, and a voltage limiter coupled to output terminals of the first gain stage to limit an output voltage of the first gain stage to a predetermined level.

15. The system of claim 14, wherein the first gain stage comprises a common gate amplifier having input terminals coupled to receive the differential signals, wherein the differential signals are substantially greater than the supply voltage of the buffer.

16. The system of claim 14, further comprising:
a physical media attach (PMA) device comprising a framer including the driver; and
a physical media dependent (PMD) device comprising a serializer/deserializer including the buffer.

17. The system of claim 14, further comprising:
a first integrated circuit (IC) coupled to a motherboard and to receive a first supply voltage therefrom, the first IC including the driver; and
a second IC including the buffer coupled to the motherboard and to receive the supply voltage of the buffer therefrom, wherein the first supply voltage is greater than the supply voltage of the buffer.

18. The system of claim 17, wherein the differential signals comprises low voltage positive emitter coupled logic (LVPECL) signals, and the buffer is to convert the LVPECL signals to low voltage differential signals.

19. An apparatus comprising:
means for receiving an input common mode voltage in an input buffer;
gain stage means for directly amplifying and level shifting the input common mode voltage from a first voltage that extends beyond a supply voltage of the input buffer to a second voltage no larger than the supply voltage; and
feedback means coupled to the gain stage means and between a bias voltage node of the gain stage means and a current source, the feedback means for receiving an output of a second gain stage means and independently controlling a first gate terminal and a second gate terminal of the gain stage means based on the output.

20. The apparatus of claim 19, wherein the means for receiving comprises input terminals of an amplifier of the gain stage means.

21. The apparatus of claim 20, further comprising means for biasing the amplifier using the input common mode voltage.

* * * * *